US006797602B1

(12) United States Patent
Kluth et al.

(10) Patent No.: US 6,797,602 B1
(45) Date of Patent: Sep. 28, 2004

(54) METHOD OF MANUFACTURING A SEMICONDUCTOR DEVICE WITH SUPERSATURATED SOURCE/DRAIN EXTENSIONS AND METAL SILICIDE CONTACTS

(75) Inventors: George Jonathan Kluth, Los Gatos, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/071,207

(22) Filed: Feb. 11, 2002

Related U.S. Application Data
(60) Provisional application No. 60/267,407, filed on Feb. 9, 2001.

(51) Int. Cl.$^7$ .................. H01L 21/3205; H01L 21/4763

(52) U.S. Cl. ..................... 438/592; 438/301; 438/586; 438/618; 438/621; 438/649; 438/664; 438/682

(58) Field of Search ................... 438/211, 299, 438/301, 585, 592, 586, 597, 618, 621, 649, 652, 655, 664, 682; 257/382, 384

(56) References Cited

U.S. PATENT DOCUMENTS

| | | | | |
|---|---|---|---|---|
| 5,168,072 A | * | 12/1992 | Moslehi | 438/300 |
| 5,242,847 A | | 9/1993 | Ozturk et al. | |
| 5,399,506 A | * | 3/1995 | Tsukamoto | 438/301 |
| 5,491,099 A | * | 2/1996 | Hsu | 438/302 |
| 5,840,592 A | | 11/1998 | Russell et al. | |
| 5,888,888 A | | 3/1999 | Talwar et al. | |
| 5,889,331 A | * | 3/1999 | Bai | 257/768 |
| 5,913,115 A | | 6/1999 | Biebl et al. | |
| 6,100,013 A | | 8/2000 | Brown et al. | |
| 6,235,568 B1 | * | 5/2001 | Murthy et al. | 438/231 |
| 6,426,278 B1 | * | 7/2002 | Nowak et al. | 438/528 |

* cited by examiner

*Primary Examiner*—Maria Guerrero

(57) ABSTRACT

Semiconductor devices, such as transistors, with a supersaturated concentration of dopant in the source/drain extension and metal silicide contacts enable the production of smaller, higher speed devices. Supersaturated source/drain extensions are subject to dopant diffusion out from the source/drain extension during high temperature metal silicide contact formation. The formation of lower temperature metal silicide contacts, such as nickel silicide contacts, prevents dopant diffusion and maintains the source/drain extensions in a supersaturated state throughout semiconductor device manufacturing.

18 Claims, 8 Drawing Sheets

METHOD OF MANUFACTURING A SEMICONDUCTOR DEVICE WITH SUPERSATURATED SOURCE/DRAIN EXTENSIONS AND METAL SILICIDE CONTACTS

RELATED APPLICATIONS

This application claims priority from U.S. Provisional Application Ser. No. 60/267,407, filed Feb. 9, 2001, incorporated herein by reference.

TECHNICAL FIELD

The present invention relates to the field of manufacturing semiconductor devices and, more particularly, to an improved salicide process of forming metal silicide contacts.

BACKGROUND OF THE INVENTION

An important aim of ongoing research in the semiconductor industry is the reduction in the dimensions of the devices used in integrated circuits. Planar transistors, such as metal oxide semiconductor (MOS) transistors, are particularly suited for use in high-density integrated circuits. As the size of the MOS transistors and other active devices decreases, the dimensions of the source/drain regions and gate electrodes, and the channel region of each device, decrease correspondingly.

The design of ever-smaller planar transistors with short channel lengths makes it necessary to provide very shallow source/drain junctions. Shallow junctions are necessary to avoid lateral diffusion of implanted dopants into the channel, since such a diffusion disadvantageously contributes to leakage currents and poor breakdown performance. Shallow source/drain junctions, for example on the order of 1,000 Å or less thick, are generally required for acceptable performance in short channel devices.

Shallow source/drain junctions have corresponding shallower source/drain extensions. As the depth of the junction decreases, the electrical resistivity of the junction increases. This increase in resistivity is particularly a problem in shallow source/drain extensions. The high resistivity of shallow source/drain regions and extensions is alleviated by supersaturating the dopant concentration in the source/drain regions and extensions. In addition, the resistivity of the source/drain regions is temperature dependent. Supersaturating the source/drain regions and extensions reduces the resistivity temperature dependence.

Metal silicide contacts are typically used to provide low resistance contacts to source/drain regions and gate electrodes. The metal silicide contacts are conventionally formed by depositing a conductive metal, such as titanium, cobalt, tungsten, or nickel, on the source/drain regions and gate electrodes by physical vapor deposition (PVD), e.g. sputtering or evaporation; or by a chemical vapor deposition (CVD) technique. Subsequently, heating is performed to react the metal with underlying silicon to form a metal silicide layer on the source/drain regions and gate electrodes. The metal silicide has a substantially lower sheet resistance than the silicon to which it is bonded. Selective etching is then conducted to remove unreacted metal from the non-silicided areas, such as the dielectric sidewall spacers. Thus, the silicide regions are aligned only on the electrically conductive areas. This self-aligned silicide process is generally referred to as the "salicide" process.

A portion of a typical semiconductor device 50 is schematically illustrated in FIG. 1A and comprises a silicon-containing substrate 10 with source/drain regions 26 formed therein. Gate oxide layer 14 and gate electrode 16 are formed on the silicon-containing substrate 10. Sidewall spacers 34 are formed on opposing side surfaces 18 of gate electrode 16. Sidewall spacers 34 typically comprise silicon based insulators, such as silicon nitride, silicon oxide, or silicon carbide. The sidewall spacers 34 mask the side surfaces 18 of the gate 16 when metal layer 36 is deposited, thereby preventing silicide from forming on the gate electrode side surfaces 18.

After metal layer 36 is deposited, heating is conducted at a temperature sufficient to react the metal with underlying silicon in the gate electrode 16 and substrate surface 12 to form conductive metal silicide contacts 38 (FIG. 1B). After the metal silicide contacts 38 are formed, the unreacted metal 36 is removed by etching, as with a wet etchant, e.g., an aqueous $H_2O_2/NH_4OH$ solution. The sidewall spacer 34, therefore, functions as an electrical insulator separating the silicide contact 38 on the gate electrode 16 from the metal silicide contacts 38 on the source/drain regions 26, as shown in FIG. 1B.

Various metals react with Si to form a silicide, however, titanium (Ti) and cobalt (Co) are currently the most common metals used to create suicides ($TiSi_2$, $CoSi_2$) when manufacturing semiconductor devices utilizing salicide technology.

Use of a $TiSi_2$ layer imposes limitations on the manufacture of semiconductor devices. A significant limitation is that the sheet resistance for lines narrower than 0.35 micrometers is high, i.e., as $TiSi_2$ is formed in a narrower and narrower line, the resistance increases. Another significant limitation is that $TiSi_2$ initially forms a high resistivity phase (C49), and transformation from C49 to a low resistivity phase (C54) is nucleation limited, i.e., a high temperature is required to effect the phase change.

Cobalt silicide, unlike $TiSi_2$, exhibits less line width dependence of sheet resistance. However, $CoSi_2$ consumes significant amounts of Si during formation, which increases the difficulty of forming shallow junctions. Large Si consumption is also a concern where the amount of Si present is limited, for example, with silicon on insulator (SOI) substrates. Without enough Si to react with Co to form $CoSi_2$, a thin layer of $CoSi_2$ results. The thickness of the silicide layer is an important parameter because a thin silicide layer is more resistive than a thicker silicide layer of the same material, thus a thicker silicide layer increases semiconductor device speed, while a thin silicide layer reduces device speed.

One of the concerns recognized by the inventors in employing supersaturated source/drain extensions is their susceptibility to deactivation when exposed to moderately high temperatures, such as those typically employed in cobalt silicide or titanium silicide processing. High temperature annealing during the silicide formation step increases lateral and vertical diffusion of the dopants in the source/drain regions and extensions. Increased vertical diffusion of the dopant results in slower, deeper junctions, while increased lateral diffusion of the dopant can result injunction leakage. Furthermore, every time a wafer is heated and cooled crystal damage from dislocations occur. A high concentration of dislocations can cause device failure from leakage currents. For example, formation of $CoSi_2$ contacts requires a two-step annealing process that includes a first annealing at approximately 500° C. and a second annealing at approximately 800° C. The 800° C. annealing step is high enough to cause dopant diffusion, which lowers the electrical conductivity of the source/drain regions and extensions.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

Recently, attention has turned towards using nickel to form NiSi utilizing salicide technology. Using NiSi is advantageous over using $TiSi_2$ and $CoSi_2$ because many limitations associated with $TiSi_2$ and $CoSi_2$ are avoided. For purposes of this invention, one of the primary advantages of NiSi technology is the low processing temperatures employed. When forming NiSi, a low resistivity phase is the first phase to form, and does so at a relatively low temperature. Typically, the annealing temperature is between 400° C. and 600° C. Nickel silicide is normally annealed in a one step process, versus a process requiring an anneal, an etch, and a second anneal, as is normal for $TiSi_2$ and $CoSi_2$. Nickel silicide also exhibits low film stress, i.e., causes less wafer distortion.

There exists a need in the semiconductor device manufacturing art to provide a process of forming transistors with source/drain extensions having supersaturated dopant concentrations, without exposing the transistors to high processing temperatures in subsequent processing steps, such as forming silicide contacts.

These and other needs are met by the embodiments of the present invention, which provide a method of manufacturing a semiconductor device comprising providing a silicon-containing substrate, having an upper surface, with a gate insulating later and gate electrode formed on the substrate upper surface. The gate electrode has an upper surface and opposing side surfaces. Source/drain regions are formed in the substrate spaced apart from the gate electrode. Supersaturated dopant concentration source/drain extensions are formed in the substrate between the source/drain regions and the gate electrode. Metal silicide contacts are formed on the upper surfaces of the gate electrode and the substrate in a manner sufficient to maintain the supersaturated dopant concentration in the source/drain extensions.

The earlier stated needs are also met by other embodiments of the present invention that provide a semiconductor device comprising a silicon-containing semiconductor substrate having, an upper surface, with a gate insulating layer and a gate electrode formed on the upper surface of the substrate. The gate electrode has an upper surface and opposing side surfaces. Source/drain regions are formed in the substrate spaced apart from the gate electrode and supersaturated dopant concentration source/drain extensions are situated between the source/drain regions and the gate electrode. The gate electrode and the substrate have metal silicide contacts formed on their upper surfaces.

The earlier stated needs are further met by other embodiments of the instant invention that as provide a method of manufacturing a semiconductor device, the method comprising providing a silicon-containing semiconductor substrate. A gate oxide layer is formed on the semiconductor substrate and a conductive gate material layer is formed over the gate oxide layer. The gate material layer and gate oxide layer is patterned to form a gate electrode having an upper surface and opposing side surfaces. A layer of insulating material is deposited over the gate electrode and the semiconductor substrate. The insulating material is patterned to form sidewall spacers on the opposing side surfaces of the gate electrode. Source/drain regions are formed by ion implanting a dopant into the substrate and heating the substrate to activate the source/drain regions. After forming the source/drain regions the sidewall spacers are removed. Supersaturated dopant concentration source/drain extension are formed between the gate electrode and source/drain regions. A second layer of insulating material is deposited over the gate electrode and semiconductor substrate and patterned to form sidewall spacers on the opposing side surfaces of the gate electrode. A metal layer is then deposited over the gate electrode upper surface, sidewall spacers, and substrate upper surface. The metal layer is heated at a temperature to react the metal with underlying silicon to form metal silicide contacts on the gate electrode and substrate upper surfaces without reducing dopant concentration in the source/drain extensions below a supersaturated dopant concentration. The metal that did not react to form metal silicide is removed.

This invention addresses the need for manufacturing shallow junction semiconductor devices with high conductivity silicide contacts and increased device speed. This invention reduces the possibility of diffusion of dopant from the source/drain regions and extensions. This invention provides a novel and elegant manufacturing method for producing semiconductor devices with supersaturated dopant concentration source/drain extensions.

The foregoing and other features, aspects, and advantages of the present invention will become apparent in the following detailed description of the present invention when taken conjunction with the accompanying drawings.

DETAILED DESCRIPTION OF THE INVENTION

Figure 1A:
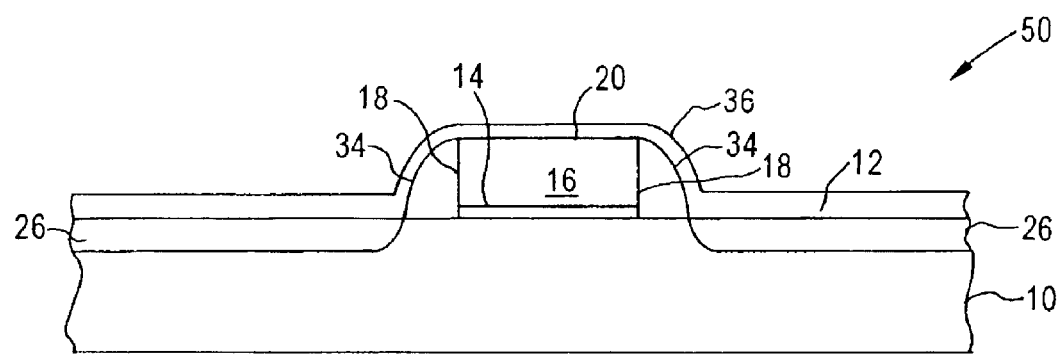
FIGS. 1A and 1B schematically illustrate a prior art semiconductor device before and after forming silicide contacts.
Figure 1B:
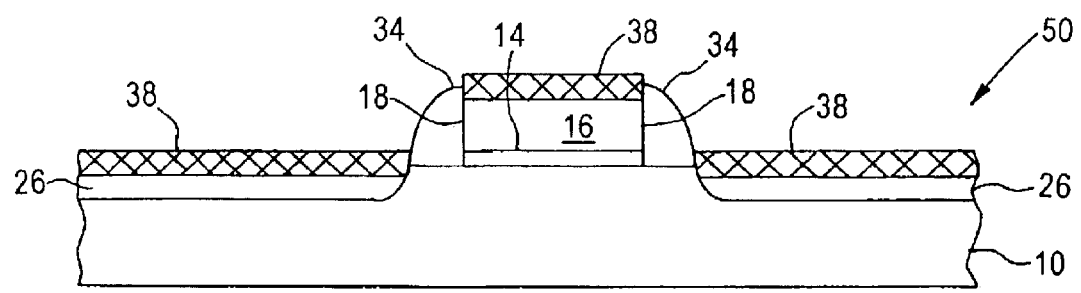

The present invention addresses and solves problems related to the production of semiconductor devices with improved performance using supersaturated dopant concentration source/drain extensions. A concern with supersaturated dopant concentrations in source/drain extensions is their susceptibility to deactivation when annealed to moderately high temperatures. The present invention solves this problem, in part, by forming supersaturated source/drain extensions and laser annealing the source/drain extensions after dopant implant. The semiconductor device is then provided with nickel silicide contacts formed at relatively low annealing temperatures, when compared to those employed in other types of silicide processing. The source/drain extensions, therefore, remain in a supersaturated state throughout device processing because the lower temperature anneal used to form the metal suicide contacts prevents dopant diffusion from the source/drain extensions during silicidation.

The invention will be described in conjunction with the formation of the semiconductor devices in the accompanying drawings. However, these are exemplary only, as the claimed invention is not limited to the formation of and the specific devices illustrated in the drawings.

Figure 2A:
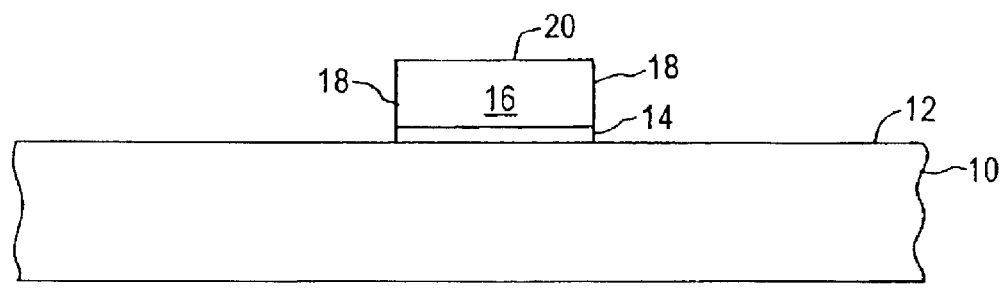
FIGS. 2A–2I schematically illustrate the formation of a semiconductor device with supersaturated source/drain extensions and metal silicide contacts according to an embodiment of the present invention.
Figure 2B:
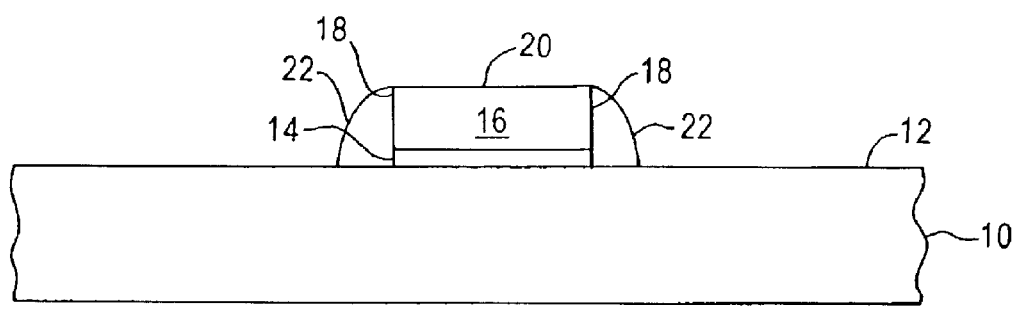

A silicon-containing semiconductor substrate 10 having an upper surface 12 is illustrated in FIG. 2A. Gate electrode 16 having opposing sides 18 and an upper surface 20 is formed on a semiconductor upper surface 12 by forming gate oxide layer 14 and conductive gate material layer 16 on a substrate upper surface and then patterning by conventional photolithographic techniques. Dielectric sidewall spacers 22 are formed on the opposing sidewalls 18 of the gate electrode 16, as shown in FIG. 2B. The dielectric layer, e.g., silicon oxide, silicon nitride, or silicon carbide, is deposited over the gate electrode 16 and the substrate upper surface 12 and patterned using an anisotropic etch to form the sidewall spacers 22. The dielectric layer is typically deposited to a thickness of about 500 Å to about 2000 Å.

Figure 2C:
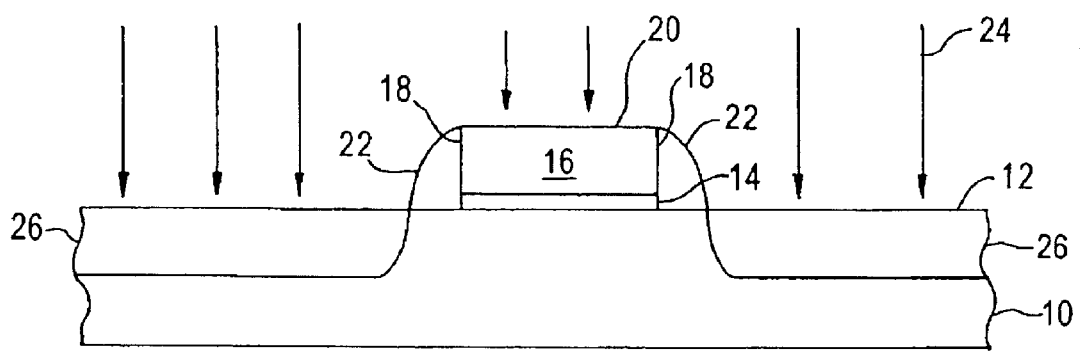

Source/drain regions 26 are formed by implanting dopant 24 into the substrate 10 as shown in FIG. 2C. The source/drain regions are formed by ion implanting at an implantation dosage of about $1\times10^{15}$ ions/cm$^2$ to about $6\times10^{15}$ ions/cm$^2$ and an implantation energy of about 10 keV to about 70 keV. In certain embodiments of the present invention an ion implantation energy of about 10 keV to about 30 keV has been effective in forming the source/drain regions. Conventional dopants, such as As, B, BF$_2$, P, or Sb are advantageously used to form the source/drain regions. After implanting the dopant, the source/drain regions are activated by a rapid thermal anneal at a temperature greater than 1000° C., e.g., 1100° C., for a period of time sufficient to activate the source/drain regions, eg. 1 second to 60 seconds. Alternatively, the source/drain regions can be activated by heating to a temperature of about 800° C. to about 1,000° C. to for about 1 minute to about 30 minutes.

As discussed earlier, the present invention provides supersaturated source/drain extensions. Exposure of these extensions to temperatures of approximately 800° C. or higher leads to deactivation of the dopants. Hence, the doping and higher temperature annealing of the source/drain regions 26 is performed prior to the formation of the source/drain extensions in the present invention.

Figure 2D:
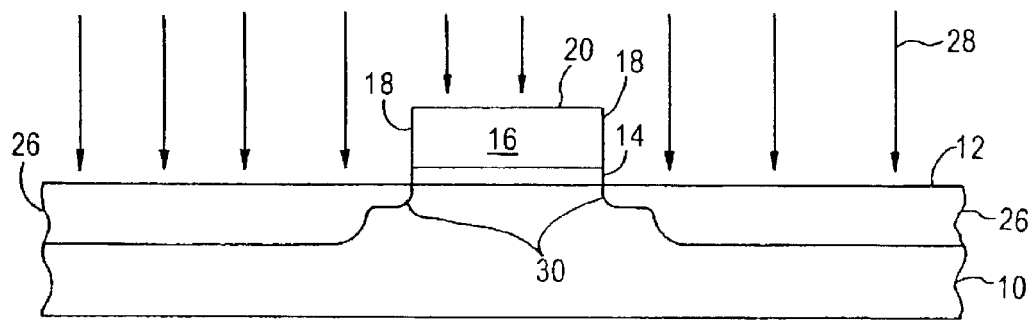

The sidewall spacers 22 are removed after forming the source/drain implants 26. Sidewall spacers 22 can be removed by etching, as with a wet etchant. The etchant used depends on the composition of the sidewall spacers. For example, if the sidewall spacers comprise silicon oxide, HF or a buffered HF solution would be the etchant, whereas if the spacers comprise silicon nitride, hot H$_3$PO$_4$ would be the etchant. After removal of the sidewall spacers 22 and activation of the source/drain regions 26, source/drain extensions 30 are formed by ion implanting a dopant 28 into the substrate 10 FIG. 2D). A conventional dopant is implanted at an implantation dosage of about $1\times10^4$ ions/cm$^2$ to about $1\times10^{15}$ ions/cm$^2$ and at an implantation energy of about 1 keV to about 10 keV until a supersaturated doping concentration is achieved in the substrate 10, i.e. about $1\times10^{21}$ atoms/cm$^3$.

Figure 2E:
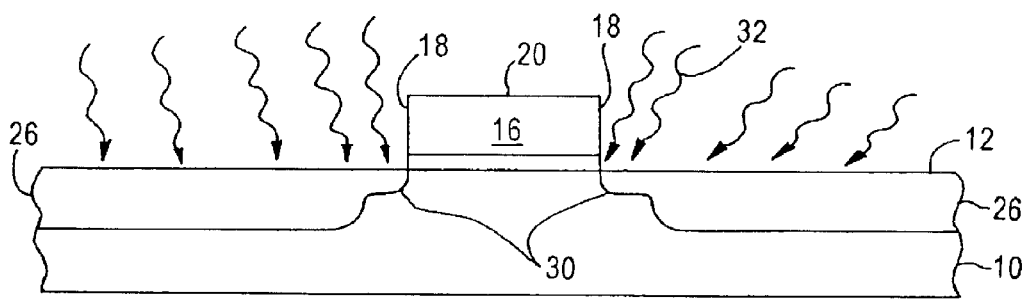

In order to maintain the supersaturated concentration dopant in the source/drain extensions, the source/drain extensions have to be activated without exposing them to enough heat to cause excessive dopant diffusion. As shown in FIG. 2E, source/drain extensions 30 are activated by exposing the semiconductor substrate 10 to laser radiation 32 of sufficient energy and exposure duration to cause localized annealing of the substrate 10 without generating enough heat to cause the dopant to diffuse out from the supersaturated source/drain extensions 30. The source/drain regions 26 and extensions 30 are exposed to laser radiation at an energy density of about 0.1 J/cm$^2$ to about 5.0 J/cm$^2$. Pulsed laser radiation has been found to be effective at locally annealing without generating excessive heat in the substrate to cause dopant diffusion. The laser energy can be applied to the substrate 12 using laser pulse widths of about 10 to 100 nanoseconds at a frequency of about 1 Hz to about 1,000 Hz. Each exposed portion of the substrate 12 can be exposed to a plurality of laser pulses, e.g., 1–10 pulses, to insure complete activation. There is no limitation on the type of laser that is used to provide the laser pulses, as long as it can provide the required amount of energy and the required pulse parameters. Ultratech Stepper Verdant Technologies Division and Lambda Physik provide lasers for annealing silicon-containing semiconductor substrates. Annealing lasers include Nd—YAG and excimer ultraviolet lasers.

Figure 2F:
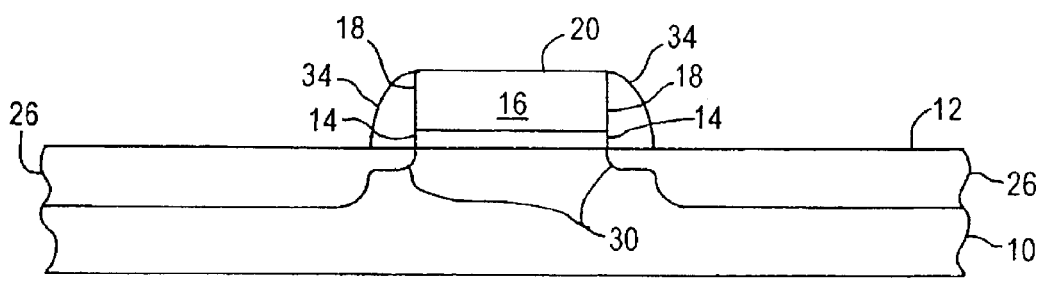
Figure 2G:
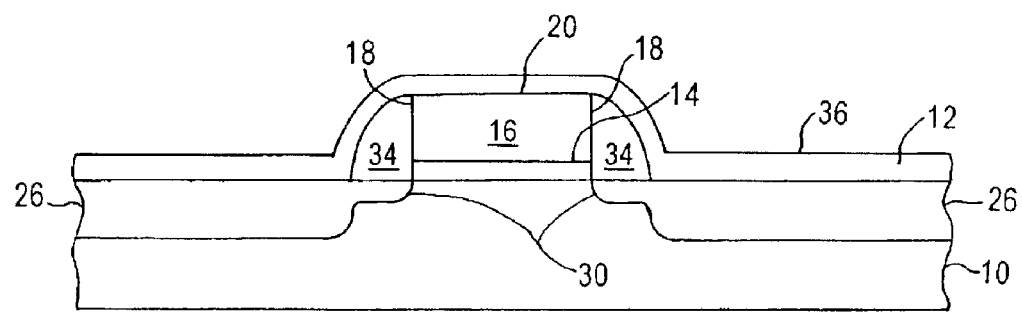

After laser exposure, a second layer of insulating material (e.g. silicon oxide, silicon nitride) is deposited over the gate electrode and semiconductor substrate and patterned to form sidewall spacers 34 on the gate electrode opposing sidewall surfaces 18 (FIG. 2F). A metal layer 36 is subsequently deposited over the upper surface of the substrate 12, sidewall spacers 34, and the gate electrode upper surface 20 (FIG. 2G). Metal layer 36 is deposited to a thickness of about 100 Å to about 500 Å by a PVD method, such as sputtering or evaporation, or a CVD method.

The metal layer 36 can comprise Ti, Co, Ni, Mo, Ta, W, Cr, Pt, or Pd. However, a metal which forms metal silicide at a relatively low temperature, such as Ni, is preferred in this invention. Ni forms nickel silicide (NiSi) at about 500° C. to about 650° C. The annealing temperature to form NiSi is below the temperature at which significant diffusion of the dopants from the source/drain regions and extensions occurs. Therefore, when a NiSi contact is formed in accordance with the present invention, the source/drain extensions retain the supersaturated dopant concentration and the dopants are not deactivated.

Figure 2H:
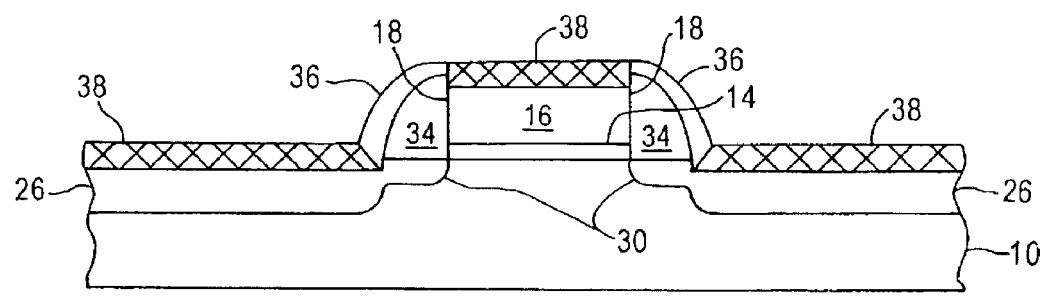
Figure 2I:
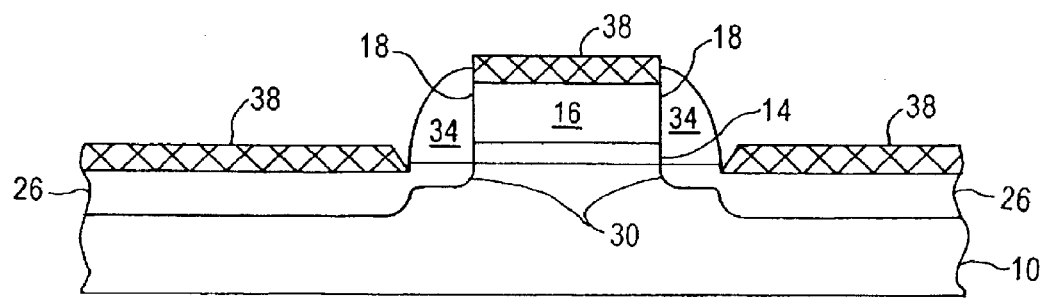

The deposited metal layer 36 is subsequently annealed to form the metal silicide contacts 38, as shown in FIG. 2H. The metal layer 36 is heated to a temperature of about 350° C. to about 800° C. for about 10 seconds to about 60 minutes. The heating causes the metal layer 36 to react with underlying silicon in the source/drain regions 26 and gate electrode 16. The metal layer 36 does not react with the dielectric sidewall spacers 34. In certain embodiments, such as when Ni is the metal layer 36, the metal layer is heated for about 10 seconds to about 30 minutes at a temperature of about 350° C. to less than 700° C., to form NiSi. It has been found that NiSi contacts can be advantageously formed by heating metal layer for about 15 seconds to about 120 seconds at about 400° C. to about 600° C. If the annealing temperature is below about 350° C. or greater than 700° C. relatively low conductivity in Ni$_2$Si or NiSi$_2$ are respectively formed when the metal layer 36 is Ni. After formation of the metal contacts 38, the metal in layer 36 that did not react to form metal silicide is removed by etching, as with a wet etchant, e.g., and aqueous H$_2$O/NH$_4$OH solution, as shown in FIG. 2I.

Figure 3A:
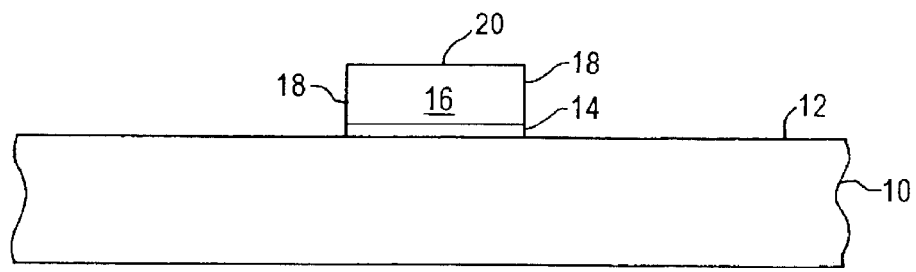
FIGS. 3A–3I schematically illustrate the formation of a semiconductor device with supersaturated source/drain extensions and metal silicide contacts according to an embodiment of the present invention.
Figure 3B:
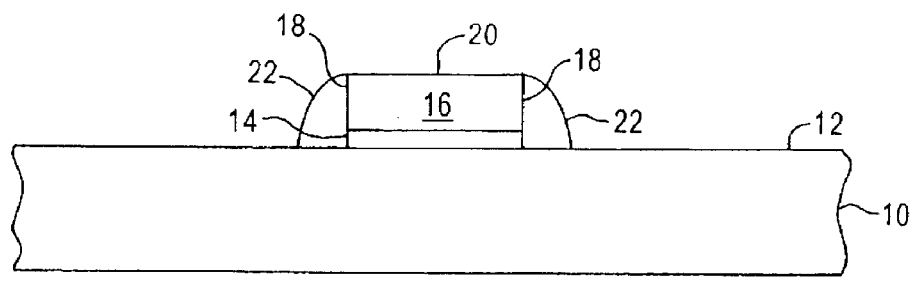
Figure 3C:
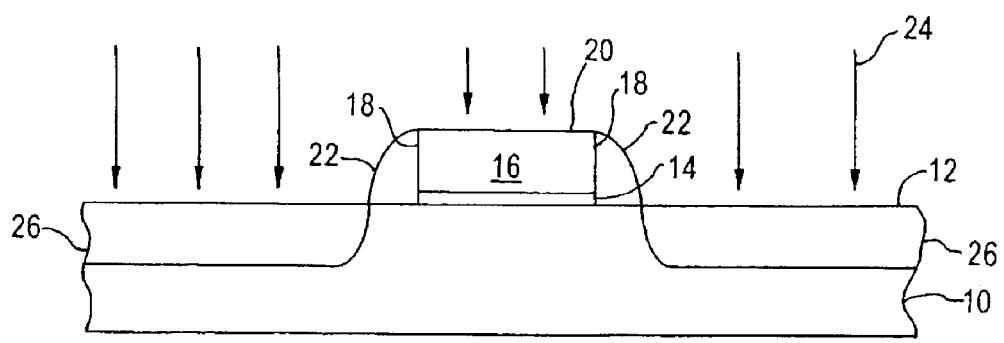

An alternative embodiment for manufacturing semiconductor devices with supersaturated source/drain extensions and metal silicide contacts is exemplified in FIGS. 3A–3I. In FIG. 3A a semiconductor substrate 10 is provided with a gate oxide layer 14 and gate electrode 16 formed by the method recently described herein. The gate oxide layer is typically about 40 Å to about 100 Å thick. The gate electrode 16 typically comprises a polysilicon layer about 2,000 Å to about 4,000 Å thick.

Dielectric sidewall spacers 22 are formed on the gate opposing sidewalls 18 (FIG. 3B) and dopant 24 is ion implanted into the substrate 10 to form source/drain regions 26 (FIG. 3C), as previously described. After forming the source/drain regions 26, sidewall spacers 22 are removed by etching.

Figure 3D:
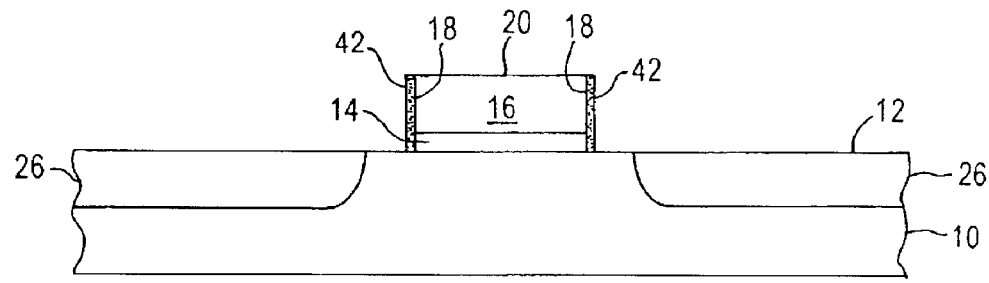

After removal of sidewall spacers 22, a thin oxide film 42, about 10 Å to about 300 Å thick, is formed on the gate opposing sidewalls 18, as by a deposition technique or thermal oxidation. Oxide layer 42 is patterned using an anisotropic etch to form the thin oxide film 42 on the gate opposing sidewall surfaces 18, as shown in FIG. 3D.

Figure 3E:
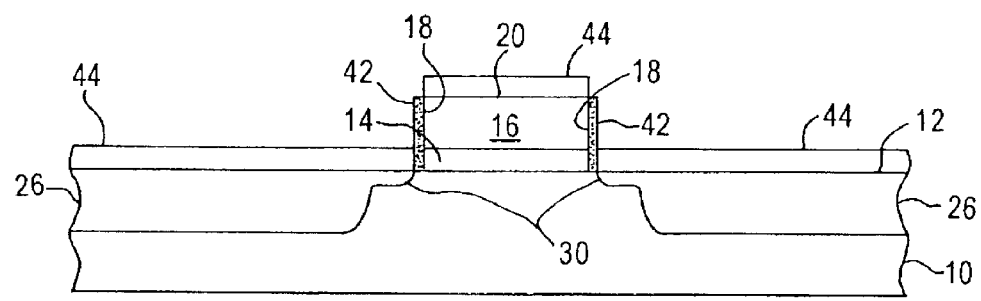

An epitaxial layer 44 comprising a supersaturated concentration of dopant in silicon is deposited on the substrate upper surface 12 and the gate electrode upper surface 20 by doped selective epitaxy, as shown in FIG. 3E. The doped epitaxial layer 44 is deposited to a thickness of about 300 Å to about 1,000 Å. Doped selective epitaxy is performed with a mixture of gases including silane ($SiH_4$) and a dopant gas in a hydrogen ($H_2$) carrier gas. HCl gas may be added to the $SiH_4$/dopant gas mixture. The epitaxial layer 44 is formed at a temperature of about 700° C. to about 900° C. and at a pressure of about 1 torr to about 700 torr. The $SiH_4$ and the dopant gas are applied in a mixture of a sufficient concentration to form supersaturated dopant concentration source/drain extensions. At the epitaxial layer formation temperature and pressure some dopant will diffuse into the substrate 10 to extend the source/drain extension 30 below the substrate upper surface 12 (FIG. 3E).

Hydrides of the desired dopant are used as the dopant gases. For example, if As is the desired dopant then arsine ($AsH_3$), is the dopant gas. Likewise, if boron is the desired dopant then borane ($B_2H_6$) is the dopant gas and if phosphorous (P) is the desired dopant then phosphine ($PH_3$) is the dopant gas. The dopant gas is mixed with $SiH_4$ at a concentration of about 10 ppm to about 100 ppm to achieve the desired epitaxial layer concentration. The $SiH_4$/dopant gas mixture is applied to the substrate in about a 10 percent solution with $H_2$ carrier gas. The epitaxial layer is selectively applied such that it does not form along the thin oxide film 42.

Figure 3F:
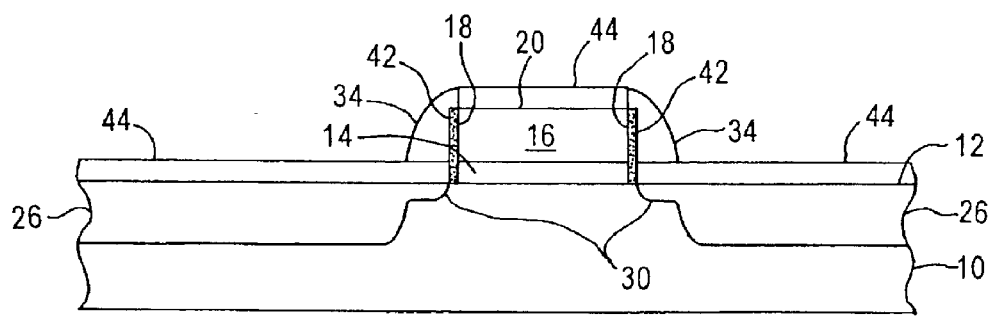

After forming the epitaxial layer 44 a second layer of insulating material is formed over the gate electrode 16 and the epitaxial layer 44 and is patterned by anisotropic etch to form sidewall spacers 34, as shown in FIG. 3F.

Figure 3G:
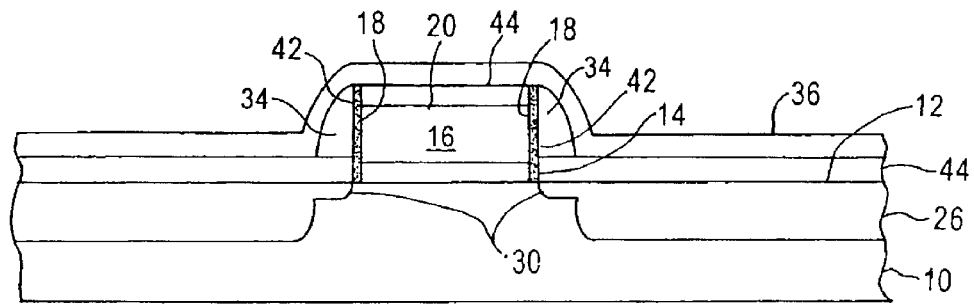
Figure 3H:
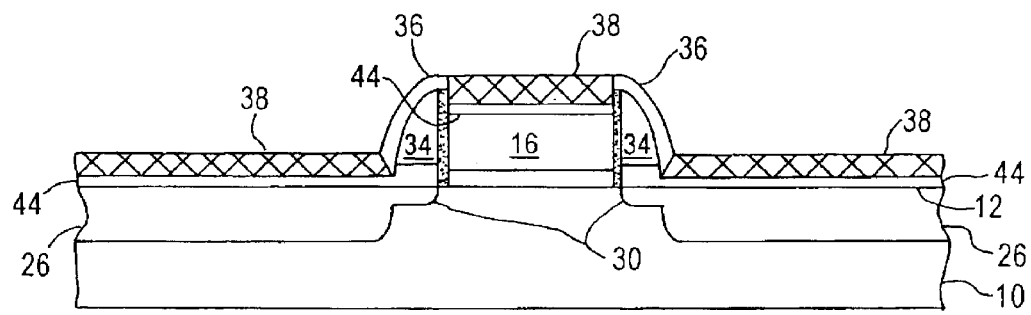
Figure 3I:
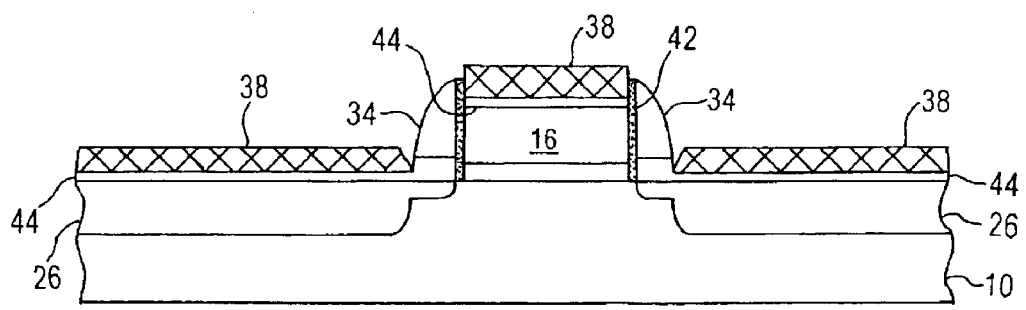

After forming the sidewall spacers 34, a metal layer 36 is formed over the sidewall spacers 34 and the epitaxial layer 44 (FIG. 3G). As described herein, metal layer 36 is preferably nickel. Metal silicide contacts 38 are formed by heating the metal layer 36 to react with underlying silicon in the doped epitaxial layer 44, as shown in FIG. 3H. The formation of the metal silicide contacts 38 is conducted at a temperature sufficiently low enough to prevent dopant diffusion in order to maintain the supersaturated dopant concentration in the epitaxial layer 44. As explained herein, Ni is the preferred metal in this invention for forming metal silicide contacts because the temperature required for reacting nickel with silicon to form NiSi is below the temperature at which a significant amount of dopant diffusion occurs. After formation of the metal silicide contacts 38, the metal layer 36 which did not react to form metal silicide is removed by etching, as shown in FIG. 3I.

Figure 4:
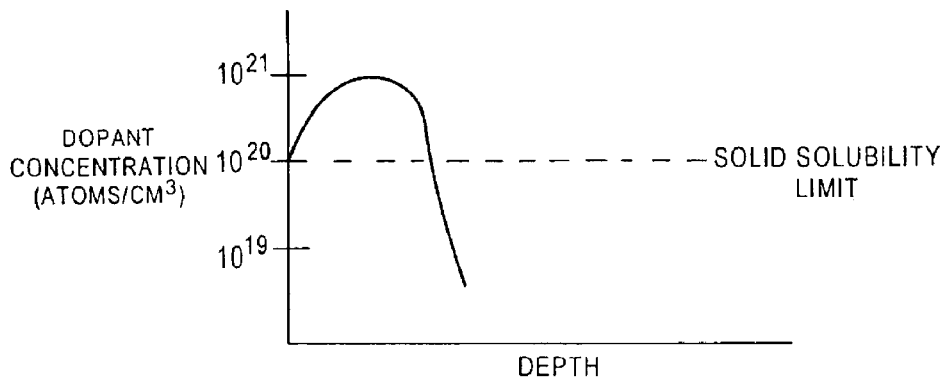
FIG. 4 graphically depicts doping concentration in supersaturated source/drain extensions.
Figure 5:
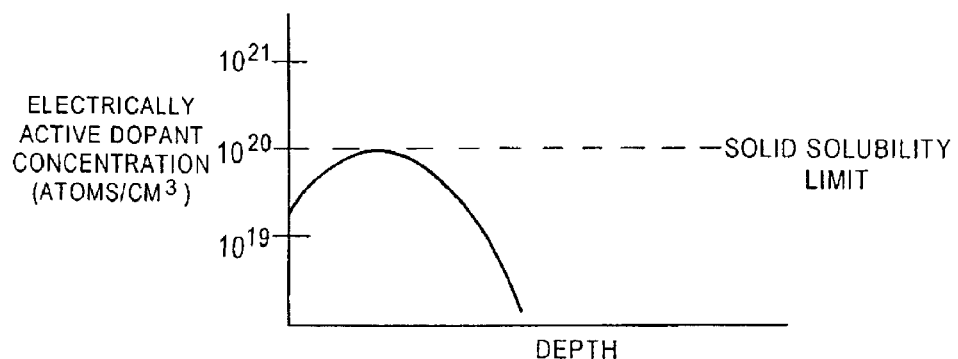
FIG. 5 graphically depicts dopant concentration in source/drain extensions in a device with silicide contacts formed with a high temperature anneal.
Figure 6:
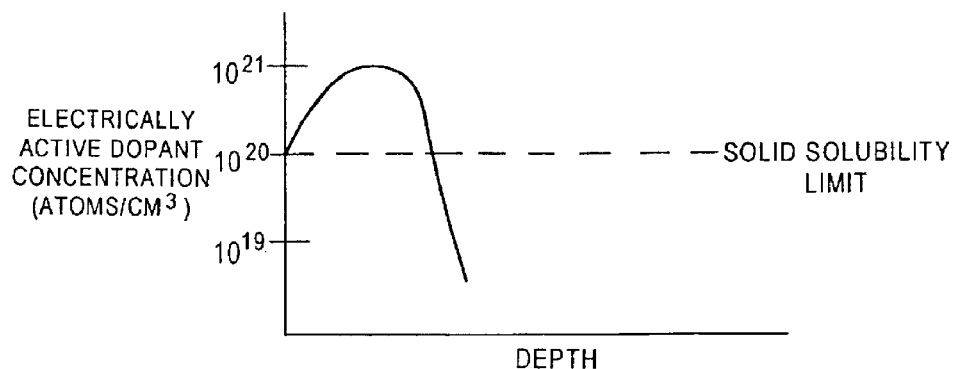
FIG. 6 graphically depicts dopant concentration in source/drain extensions in a device with silicide contacts formed with a low temperature anneal.

FIG. 4 depicts dopant concentration of source/drain extensions formed with a supersaturated concentration of dopant in the source/drain extensions versus the depth of the source/drain extensions. FIG. 5 depicts the dopant concentration in a source/drain extension region after forming metal silicide contacts with high temperature annealing, such as forming $CoSi_2$ contacts at 800° C. As can be seen in FIG. 5, high temperature silicide formation causes diffusion of the dopants in the source/drain extensions so that the dopant concentration is lowered to the solid solubility limit. In contrast to high temperature silicide contact formation, FIG. 6 depicts the dopant concentration in source/drain extensions after the formation of silicide contacts with a low temperature anneal, e.g. NiSi contact formation, in accordance with embodiments of the present invention.

High speed semiconductor devices with shallow junctions are required to meet the demands of faster and smaller devices. Transistors with supersaturated dopant concentration source/drain, extensions combine high speed with shallow junctions. However, the supersaturated dopant concentration cannot be maintained throughout device processing because of the high temperature annealing required when forming $CoSi_2$ or $TiS_2$ contacts. Metal silicide contacts formed at a temperature low enough to prevent dopant diffusion from the source/drain extensions, such as nickel silicide, enables the production of semiconductor devices with supersaturated source/drain extensions and high conductivity contacts. The present invention provides the benefits of shallow junction MOS transistors with reduced crystal damage, due to high temperature annealing, in addition to maintaining the supersaturated source/drain extensions. Furthermore, the formation of a semiconductor device with a lower temperature silicide formation step enables a more economical, energy-conserving manufacturing process.

The embodiments illustrated in the instant disclosure are for illustrated purposes only. They should not construed to limit the scope of the claims. As is clear to one of ordinary skill in this art, the instant disclosure encompasses a wide variety of embodiments not specifically illustrated herein.

What is claimed is:

1. A method of manufacturing a semiconductor device, the method comprising:

providing a silicon-containing substrate, having an upper surface, comprising: a gate electrode formed on the upper surface of the substrate with a gate insulating layer therebetween, the gate electrode having an upper surface and opposing side surfaces, and source/drain regions in the substrate spaced apart from the gate electrode;

forming supersaturated dopant concentration source/drain extensions in the substrate between the source/drain regions and the gate electrode; and forming metal silicide contacts on the upper surfaces of the gate electrode and the substrate, in a manner sufficient to maintain the supersaturated dopant concentration in the source/drain extensions.

2. The method according to claim 1, wherein the temperature is maintained below about 700° C. throughout the forming of the metal silicide contacts.

3. The method according to claim 2, wherein the metal silicide contacts are made of NiSi.

4. The method according to claim 3, wherein the silicon containing substrate further comprises sidewall spacers on the gate electrode opposing side surfaces, the method further comprising forming source/drain regions and subsequently removing the sidewall spacers prior to forming the source/drain extensions.

5. The method according to claim 3, wherein the step of forming the metal silicide contacts comprises:
depositing a dielectric layer over the substrate and gate electrode upper surfaces;
patterning the dielectric layer to form sidewall spacers on the gate electrode opposing side surfaces;
depositing a nickel layer over the gate electrode upper surface, sidewall spacers, and substrate upper surface;
heating to react the nickel layer with underlying silicon in the gate electrode and source/drain regions to form the nickel silicide (NiSi) contacts;
and removing the nickel that did not react to form nickel silicide.

6. The method according to claim 3, wherein the nickel layer is heated at a temperature of about 400° C. to about 600° C. for about 15 seconds to about 120 seconds to form the NiSi contacts.

7. The method according to claim 3, wherein the dopant concentration in the source/drain extensions is about $10^{21}$ ions/cm$^3$.

8. The method according to claim 3, wherein the step of forming the supersaturated source/drain extensions comprises:
ion implanting a dopant; and
exposing the dopant implants to laser radiation at an energy density sufficient to anneal the dopant implants.

9. The method according to claim 3, wherein the step of forming the supersaturated source/drain extensions comprises forming the source/drain extensions by doped selective epitaxy.

10. The method according to claim 8, wherein the source/drain extensions are formed at an ion implantation dosage of about $1\times10^{14}$ ions/cm$^2$ to about $1\times10^{16}$ ions/cm$^2$ and an ion implantation energy of about 1 keV to about 50 keV, and with a laser radiation energy density of about 0.1 J/cm$^2$ to about 5.0 J/cm$^2$.

11. The method according to claim 10, wherein the step of forming the source/drain extensions by doped selective epitaxy comprises:
forming an oxide layer on the semiconductor substrate and gate electrode;
patterning the oxide layer to form an oxide film on the gate opposing side surfaces;
forming an epitaxial layer by applying a gas mixture comprising SiH$_4$, and a dopant gas to the substrate surface at a temperature of about 700° C. to about 900° C. and at a pressure of about 1 torr to about 700 torr.

12. A method of manufacturing a semiconductor device, the method comprising:
providing a silicon-containing semiconductor substrate;
forming a gate oxide layer on the semiconductor substrate;
forming a conductive gate material layer over the gate oxide layer;
patterning the gate material layer and gate oxide layer to form a gate electrode having an upper surface and opposing side surfaces, with a gate oxide layer thereunder,
depositing a layer of insulating material over the gate electrode and semiconductor substrate;
patterning the insulating material to form sidewall spacers on the opposing side surfaces of the gate electrode;
forming source/drain regions by ion implanting a dopant into the substrate;
removing the sidewall spacers;
heating the substrate to activate the source/drain regions;
forming supersaturated dopant concentration source/drain extensions between the gate electrode and source/drain regions;
depositing a second layer of insulating material over the gate electrode and semiconductor substrate;
patterning the second layer of insulating material to form sidewall spacers on the opposing side surfaces of the gate electrode;
depositing a metal layer over the gate electrode upper surface, sidewall spacers, and substrate upper surface;
heating at a temperature to react the metal layer with underlying silicon to form metal silicide contacts on the gate electrode and substrate upper surfaces without reducing the dopant concentration in the source/drain extensions below a supersaturated dopant concentration; and
removing the metal that did not react to form metal silicide.

13. The method according to claim 12, wherein the metal layer is Ni.

14. The method according to claim 13, wherein the dopant concentration in the source/drain extensions is about $10^{21}$ ions/cm$^3$.

15. The method according to claim 13, wherein the supersaturated source/drain extensions are formed by doped selective epitaxy.

16. The method according to claim 13, wherein the step of forming the supersaturated source/drain extension comprises:
ion implanting a dopant; and
exposing the dopant implants to laser radiation at an energy density sufficient to anneal the dopant implants.

17. The method according to claim 14, wherein the step of forming the source/drain extensions by doped selective epitaxy comprises;
forming an oxide layer on the gate electrode and semiconductor substrate;
patterning the oxide layer to form an oxide film on the gate elec surfaces;
forming an epitaxial layer on the substrate by applying a gas mixture comprising SiH$_4$ and a dopant gas to the substrate surface at a temperature of about 700° C. to about 900° C. and at a pressure of about 1 torr to about 700 torr.

18. The method according to claim 16, wherein source/drain extensions are formed at an implantation dosage of about $1\times10^{14}$ ions/cm$^2$ to about $1\times10^{16}$ cm$^2$ and an ion implantation energy of about 1 keV to about 50 keV, and with a laser radiation energy density of about 0.1 J/cm$^2$ to about 5.0 J/cm$^2$.

* * * * *